(12) United States Patent
Morita et al.

(10) Patent No.: US 9,659,883 B2
(45) Date of Patent: May 23, 2017

(54) THERMALLY CURABLE RESIN SHEET FOR SEALING SEMICONDUCTOR CHIP, AND METHOD FOR MANUFACTURING SEMICONDUCTOR PACKAGE

(71) Applicant: NITTO DENKO CORPORATION, Ibaraki-shi, Osaka (JP)

(72) Inventors: Kosuke Morita, Ibaraki (JP); Tsuyoshi Ishizaka, Ibaraki (JP); Eiji Toyoda, Ibaraki (JP); Goji Shiga, Ibaraki (JP); Chie Iino, Ibaraki (JP); Jun Ishii, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 15/023,501

(22) PCT Filed: Sep. 9, 2014

(86) PCT No.: PCT/JP2014/073755
§ 371 (c)(1),
(2) Date: Mar. 21, 2016

(87) PCT Pub. No.: WO2015/045846
PCT Pub. Date: Apr. 2, 2015

(65) Prior Publication Data
US 2016/0211228 A1    Jul. 21, 2016

(30) Foreign Application Priority Data

Sep. 24, 2013  (JP) ................................ 2013-196854
Aug. 20, 2014  (JP) ................................ 2014-167223

(51) Int. Cl.
*H01L 21/78*   (2006.01)
*H01L 23/00*   (2006.01)
(Continued)

(52) U.S. Cl.
CPC .......... *H01L 23/562* (2013.01); *H01L 21/486* (2013.01); *H01L 21/561* (2013.01);
(Continued)

(58) Field of Classification Search
CPC ......... H01L 2924/0665; H01L 25/0652; H01L 25/0657; H01L 2924/18161; H01L 25/50;
(Continued)

(56) References Cited

U.S. PATENT DOCUMENTS 8,592,994 B2 * 11/2013 Tachibana ............... C08L 63/00
257/778
2002/0147264 A1  10/2002 Takeuchi et al.
(Continued)

FOREIGN PATENT DOCUMENTS

JP     H05/267371 A    10/1993
JP     2005/060584 A    3/2005
(Continued)

OTHER PUBLICATIONS

International Preliminary Report on Patent Patentability, dated Apr. 7, 2016, for International Application No. PCT/JP2014/073755, including translation of the Written Opinion by the International Bureau.
(Continued)

*Primary Examiner* — Jasmine Clark
(74) *Attorney, Agent, or Firm* — Knobbe Martens Olson & Bear, LLP (57) ABSTRACT

The present invention provides a thermally curable resin sheet for sealing a semiconductor chip having excellent reliability and storability while being reduced in warpage deformation due to the volume shrinkage of the thermally curable resin sheet, and a method for manufacturing a semiconductor package. The present invention relates to a thermally curable resin sheet for sealing a semiconductor (Continued)

chip, wherein an activation energy (Ea) satisfies the following formula (1), a glass transition temperature of a product thermally cured at 150° C. for 1 hour is 125° C. or higher, and a thermal expansion coefficient α [ppm/K] of the thermally cured product at the glass transition temperature or lower and a storage modulus E' [GPa] at 25° C. of the thermally cured product satisfy the following formula (2):

$$30 \leq Ea \leq 120 \ [kJ/mol] \quad (1); \text{ and}$$

$$10{,}000 \leq \alpha \times E' \leq 300{,}000 \ [Pa/K] \quad (2).$$

11 Claims, 4 Drawing Sheets

(51) Int. Cl.
| | | |
|---|---|---|
| H01L 25/00 | (2006.01) | |
| H01L 25/065 | (2006.01) | |
| H01L 23/29 | (2006.01) | |
| H01L 23/14 | (2006.01) | |
| H01L 23/498 | (2006.01) | |
| H01L 21/48 | (2006.01) | |
| H01L 21/56 | (2006.01) | |
| H01L 23/544 | (2006.01) | |

(52) U.S. Cl.
CPC ............ *H01L 21/78* (2013.01); *H01L 23/147* (2013.01); *H01L 23/295* (2013.01); *H01L 23/49827* (2013.01); *H01L 24/19* (2013.01); *H01L 24/94* (2013.01); *H01L 24/96* (2013.01); *H01L 24/97* (2013.01); *H01L 25/0652* (2013.01); *H01L 25/0657* (2013.01); *H01L 25/50* (2013.01); *H01L 21/568* (2013.01); *H01L 23/544* (2013.01); *H01L 24/16* (2013.01); *H01L 24/32* (2013.01); *H01L 24/73* (2013.01); *H01L 24/92* (2013.01); *H01L 2223/54486* (2013.01); *H01L 2224/12105* (2013.01); *H01L 2224/14181* (2013.01); *H01L 2224/16146* (2013.01); *H01L 2224/32145* (2013.01); *H01L 2224/73204* (2013.01); *H01L 2224/73259* (2013.01); *H01L 2224/92125* (2013.01); *H01L 2224/92224* (2013.01); *H01L 2224/94* (2013.01); *H01L 2224/97* (2013.01); *H01L 2225/06513* (2013.01); *H01L 2225/06541* (2013.01); *H01L 2225/06568* (2013.01); *H01L 2225/06582* (2013.01); *H01L 2924/181* (2013.01); *H01L 2924/18161* (2013.01); *H01L 2924/18162* (2013.01); *H01L 2924/351* (2013.01); *H01L 2924/3511* (2013.01)

(58) Field of Classification Search
CPC .................. H01L 24/92; H01L 23/147; H01L 2224/92125; H01L 2924/15788; H01L 2924/351; H01L 2224/83851; H01L 24/94; H01L 24/96; H01L 24/97
See application file for complete search history.

(56) References Cited

U.S. PATENT DOCUMENTS

| | | | |
|---|---|---|---|
| 2006/0228562 A1 | 10/2006 | Ukawa et al. | |
| 2008/0012124 A1* | 1/2008 | Stapleton | C08K 5/43 |
| | | | 257/713 |
| 2011/0089549 A1* | 4/2011 | Zenbutsu | H01L 21/565 |
| | | | 257/676 |
| 2013/0217186 A1 | 8/2013 | Tani et al. | |

FOREIGN PATENT DOCUMENTS

| | | |
|---|---|---|
| JP | 2006/019714 A | 1/2006 |
| JP | 2012/227441 A | 11/2012 |
| JP | 2013/168541 A | 8/2013 |
| JP | 2006/241449 A | 9/2016 |
| WO | WO 2006/103962 A1 | 10/2006 |

OTHER PUBLICATIONS

Singaporean Office Action dated Nov. 29, 2016 in corresponding Singaporean Patent Application No. 11201602233P.

* cited by examiner

THERMALLY CURABLE RESIN SHEET FOR SEALING SEMICONDUCTOR CHIP, AND METHOD FOR MANUFACTURING SEMICONDUCTOR PACKAGE

TECHNICAL FIELD

The present invention relates to a thermally curable resin sheet for sealing a semiconductor chip, and a method for manufacturing a semiconductor package.

BACKGROUND ART

A method for manufacturing a semiconductor package has been conventionally known in which one or more semiconductor chips fixed on a substrate are sealed with a sealing resin. For example, a thermally curable resin sheet has been known as such a sealing resin (for example, refer to Patent Document 1).

PRIOR ART DOCUMENT

Patent Document

Patent Document 1: JP-A-2006-19714

SUMMARY OF THE INVENTION

Problems to be Solved by the Invention

Warpage deformation may occur on a semiconductor package due to volume shrinkage of a sealing resin in a thermal curing process. If the warpage deformation occurs due to the volume shrinkage of a sealing resin in the thermal curing process, the semiconductor package may not be sufficiently fixed (for example, sucked and fixed) to a stage, and it may be difficult to grind the sealing resin of the semiconductor package.

Because the thermal expansion coefficient of the sealing resin is normally larger than that of other elements (such as a semiconductor chip and a substrate) constituting the semiconductor package, warpage may occur on the semiconductor package, and there is room for improvement in reliability.

An object of the present invention is to solve the above-described problems and provide a thermally curable resin sheet for sealing a semiconductor chip having excellent reliability and storability while being reduced in warpage deformation due to the volume shrinkage of the thermally curable resin sheet, a method for manufacturing a semiconductor package.

Means for Solving the Problems

The present invention relates to a thermally curable resin sheet for sealing a semiconductor chip, wherein an activation energy (Ea) satisfies the following formula (1), a glass transition temperature of a product thermally cured at 150° C. for 1 hour is 125° C. or higher, and a thermal expansion coefficient $\alpha$ [ppm/K] of the thermally cured product at the glass transition temperature or lower and a storage modulus E' [GPa] at 25° C. of the thermally cured product satisfy the following formula (2):

$$30 \leq Ea \leq 120 \text{ [kJ/mol]} \quad (1); \text{ and}$$

$$10{,}000 \leq \alpha \times E' \leq 300{,}000 \text{ [Pa/K]} \quad (2).$$

Because Ea is 120 kJ/mol or less and the thermal curing can be performed at a relatively low temperature, the amount of warpage can be made small. In addition, because heating for a long period of time is not required for thermally curing the resin sheet, the resin sheet is excellent in productivity.

On the other hand, because Ea is 30 kJ/mol or more, the thermal curing can be performed after heating the thermally curable resin sheet to make the resin sheet follow unevenness (unevenness of the surface of the semiconductor wafer caused by semiconductor chips arranged thereon). As a result, the generation of voids can be suppressed. In addition, the resin sheet is good in storability.

The thermal expansion coefficient $\alpha$ [ppm/K] of the thermally cured product at the glass transition temperature or lower and the storage modulus E' [GPa] at 25° C. of the thermally cured product satisfy the formula (2). Accordingly, thermal stress generated by a difference of the thermal expansion coefficient can be relaxed, and a semiconductor package having excellent reliability can be obtained. For example, when the storage modulus E' is high in a numerical range of $\alpha \times E'$, rigidity of the thermally curable resin sheet improves, and the resin sheet absorbs or disperses the stress. In this case, because the thermal expansion coefficient $\alpha$ reduces and the thermal expansion behavior of the thermally curable resin sheet can be suppressed, mechanical damage to other elements (such as a semiconductor chip and a substrate) constituting a semiconductor package can be reduced.

Because the glass transition temperature of the thermally cured product is 125° C. or higher, a rapid change of physical properties can be suppressed in a normal application temperature range of a semiconductor package and a temperature range (maximum of 125° C.) of a thermal cycle reliability test of a semiconductor package.

The thermally curable resin sheet for sealing a semiconductor chip of the present invention preferably contains an epoxy resin, a phenol novolak-based curing agent, an inorganic filler, and a curing accelerator.

The inorganic filler is preferably silica having an average particle size of 0.5 μm to 50 μm.

The curing accelerator is preferably an imidazole-based curing accelerator. If an imidazole-based curing accelerator is used, the activation energy can be easily adjusted to be 30 kJ/mol to 120 kJ/mol and the curing reaction at a kneading temperature can be suppressed.

The content of the inorganic filler is preferably 20% by volume to 90% by volume.

The storage modulus E' at 25° C. of the thermally cured product is preferably 3 GPa to 30 GPa.

The thermal expansion coefficient $\alpha$ is preferably 3 ppm/K to 50 ppm/K.

The present invention also relates to a method for manufacturing a semiconductor package, including: a Step (A) of forming a sealed body having the thermally curable resin sheet for sealing a semiconductor chip and one or more semiconductor chips embedded in the thermally curable resin sheet for sealing a semiconductor chip, and a Step (B) of thermally curing the resin sheet of the sealed body.

In the Step (A), the semiconductor chip(s) flip-chip bonded to a semiconductor wafer are preferably embedded in the thermally curable resin sheet for sealing a semiconductor chip to form the sealed body.

In the Step (A), the semiconductor chip(s) fixed to a temporary fixing material are preferably embedded in the thermally curable resin sheet for sealing a semiconductor chip to form the sealed body.

In the Step (A), a plurality of the semiconductor chips flip-chip bonded to a semiconductor wafer are preferably embedded in the thermally curable resin sheet for sealing a semiconductor chip to form the sealed body. Further, the method for manufacturing a semiconductor package of the present invention preferably includes a Step (C) of dicing the sealed body into intended semiconductor chips after the Step (B).

MODE FOR CARRYING OUT THE INVENTION

The present invention will be described in detail with reference to embodiments mentioned below; however, the present invention is not limited to these embodiments.

Embodiment 1

Figure 1:
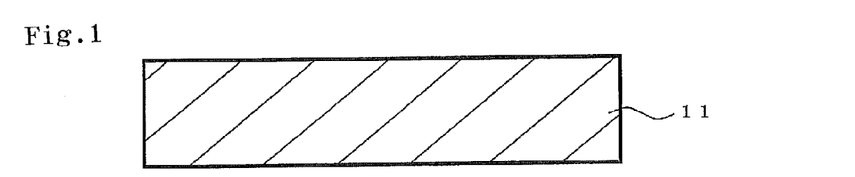
FIG. 1 is a schematic cross-sectional view of a resin sheet of Embodiment 1.

FIG. 1 is a schematic cross-sectional view of a resin sheet 11 of Embodiment 1. A support such as a polyethylene terephthalate (PET) film may be provided on both surfaces of the resin sheet 11. The support may be subjected to a release treatment to easily peel the support from the resin sheet 11.

The resin sheet 11 is thermally curable.

The activation energy (Ea) of the resin sheet 11 is 30 kJ/mol or more. Because the activation energy is 30 kJ/mol or more, the thermal curing can be performed after heating the thermally curable resin sheet to make the resin sheet follow unevenness (unevenness of the surface of the semiconductor wafer caused by semiconductor chips arranged thereon). As a result, the generation of voids can be suppressed. In addition, the resin sheet is good in storability. The activation energy of the resin sheet 11 is preferably 40 kJ/mol or more, more preferably 50 kJ/mol or more, and further preferably 60 kJ/mol or more.

The activation energy of the resin sheet 11 is 120 kJ/mol or less. Because the activation energy is 120 kJ/mol or less and the thermal curing can be performed at a relatively low temperature, the amount of warpage can be made small. In addition, because heating for long period of time is not required for thermally curing the resin sheet, the resin sheet is excellent in productivity. The activation energy of the resin sheet 11 is preferably 100 kJ/mol or less.

The activation energy can be measured by the method described in Examples.

The activation energy of the resin sheet 11 can be controlled by the type of the curing accelerator, the amount of the curing accelerator, etc.

The resin sheet 11 satisfies the following formula (2).

$$10{,}000 \leq \alpha \times E' \leq 300{,}000 \ [\text{Pa/K}] \quad (2)$$

In the formula (2), $\alpha$ is a thermal expansion coefficient [ppm/K] at the glass transition temperature or lower of a product thermally cured at 150° C. for 1 hour.

In the formula (2), E' is the storage modulus [GPa] at 25° C. of a product thermally cured at 150° C. for 1 hour.

Because the resin sheet 11 satisfies the formula (2), thermal stress generated by a difference of the thermal expansion coefficient can be relaxed. For example, when the storage modulus E' is high in a numerical range of $\alpha \times E'$, rigidity of the resin sheet 11 improves, and the resin sheet 11 absorbs or disperses the stress. In this case, because the thermal expansion coefficient $\alpha$ reduces and the thermal expansion behavior of the resin sheet 11 can be suppressed, mechanical damage to other elements (such as a semiconductor chip and a substrate) constituting a semiconductor package can be reduced.

The value of $\alpha \times E'$ is preferably 100,000 Pa/K or more. The value of $\alpha \times E'$ is preferably 200,000 Pa/K or less.

The storage modulus E' is preferably 3 GPa or more, more preferably 10 GPa or more, and further preferably 15 GPa or more. If the storage modulus E' is 3 GPa or more, a good effect of relaxing thermal stress is obtained. On the other hand, the upper limit of the storage modulus E' is not particularly limited; however, for example, the storage modulus E' is 30 GPa or less and preferably 25 GPa or less.

The storage modulus E' can be measured by the method described in Examples.

The storage modulus E' of the resin sheet 11 can be controlled by the content of the inorganic filler and the content of a thermoplastic resin. For example, the content of the inorganic filler is increased or the content of the thermoplastic resin is increased to increase the storage modulus E'.

The thermal expansion coefficient $\alpha$ is preferably 50 ppm/K or less, more preferably 20 ppm/K or less, and further preferably 15 ppm/K or less. If the thermal expansion coefficient $\alpha$ is 50 ppm/K or less, a good effect of relaxing thermal stress is obtained. On the other hand, the lower limit of the thermal expansion coefficient $\alpha$ is not particularly limited, and an example thereof is 3 ppm/K or more.

The thermal expansion coefficient $\alpha$ can be measured by the method described in Examples.

The thermal expansion coefficient $\alpha$ of the resin sheet 11 can be controlled by the content of the inorganic filler, etc. For example, the content of the inorganic filler can be increased to make the thermal expansion coefficient $\alpha$ small.

The glass transition temperature (Tg) of the thermally cured product after the resin sheet 11 is thermally cured at 150° C. for 1 hour is 125° C. or higher. If the glass transition temperature is 125° C. or higher, a rapid change of physical properties can be suppressed in a normal application temperature range of a semiconductor package and a temperature range (maximum of 125° C.) of a thermal cycle reliability test of a semiconductor package. The upper limit of the glass transition temperature of the thermally cured product is not particularly limited; however, for example, the glass transition temperature is 180° C. or lower and preferably 160° C. or lower.

The glass transition temperature can be measured by the method described in Examples.

The glass transition temperature of the thermally cured product of the resin sheet 11 can be controlled by the density of crosslinking caused by functional groups of the thermally curable resin (for example, an epoxy resin and a phenol resin). For example, a thermally curable resin having a large number of functional groups in the molecule can be used to increase the glass transition temperature.

The resin sheet 11 preferably contains an epoxy resin.

The epoxy resin is not particularly limited, and examples thereof include triphenyl methane type epoxy resin, cresol novolak type epoxy resin, biphenyl type epoxy resin, modified bisphenol A type epoxy resin, bisphenol A type epoxy resin, bisphenol F type epoxy resin, modified bisphenol F type epoxy resin, dicyclopentadiene type epoxy resin, phenol novolak type epoxy resin, phenoxy resin, and other various epoxy resins. These epoxy resins may be used alone or in combination of two or more thereof.

In order to secure reactivity, the epoxy resin is preferably a resin which has an epoxy equivalent of 150 to 250, and has a softening point or melting point of 50 to 130° C. to be solid at room temperature. Out of species of the epoxy resin, more preferred are triphenylmethane type epoxy resin, cresol novolak type epoxy resin, and biphenyl type epoxy resin from the viewpoint of the reliability of the resin sheet. And Bisphenol F type epoxy resin is preferred.

The resin sheet 11 preferably contains a phenol novolak-based curing agent. Phenol novolak resins can be preferably used as the phenol novolak-based curing agent. Among these phenol novolak resins, a phenol novolak resin having a biphenylaralkyl skeleton can be particularly preferably used. The phenol novolak-based curing agents may be used either alone or in combination of two or more thereof.

A phenol novolak-based curing agent used preferably has a hydroxyl equivalent of 70 to 250 and a softening point of 50° C. to 110° C. from the viewpoint of reactivity with the epoxy resin.

The total content of the epoxy resin and the phenol novolak-based curing agent in the resin sheet 11 is preferably 5% by weight or more. If the total content thereof is 5% by weight or more, good adhering strength of the resin sheet 11 to a semiconductor chip can be obtained. The total content of the epoxy resin and the phenol novolak-based curing agent in the resin sheet 11 is preferably 40% by weight or less, and more preferably 20% by weight or less. If the total content thereof is 40% by weight or less, moisture absorption can be suppressed.

From the viewpoint of curing reactivity, the compounding ratio of the epoxy resin to the phenol novolak-based curing agent is preferably set so that the total amount of the hydroxy groups in the phenol novolak-based curing agent is 0.7 equivalent to 1.5 equivalents and more preferably 0.9 equivalent to 1.2 equivalents per one equivalent of the epoxy groups in the epoxy resin.

The resin sheet 11 preferably contains a curing accelerator.

The curing accelerator is not particularly limited as long as it promotes curing of the epoxy resin and the phenol novolak-based curing agent. Examples thereof include imidazole-based curing accelerators such as 2-methylimidazole (trade name; 2MZ), 2-undecylimidazole (trade name; C11-Z), 2-heptadecylimidazole (trade name; C17Z), 1,2-dimethylimidazole (trade name; 1.2DMZ), 2-ethyl-4-methylimidazole (trade name; 2E4MZ), 2-phenylimidazole (trade name; 2PZ), 2-phenyl-4-methylimidazole (trade name; 2P4MZ), 1-benzyl-2-methylimidazole (trade name; 1B2MZ), 1-benzyl-2-phenylimidazole (trade name; 1B2PZ), 1-cyanoethyl-2-methylimidazole (trade name; 2MZ-CN), 1-cyanoethyl-2-undecylimidazole (trade name; C11Z-CN), 1-cyanoethyl-2-phenylimidazolium trimellitate (trade name; 2PZCNS-PW), 2,4-diamino-6-[2'-methylimidazolyl-(1')]-ethyl-s-triazine (trade name; 2MZ-A), 2,4-diamino-6-[2'-undecylimidazolyl-(1')]-ethyl-s-triazine (trade name; C11Z-A), 2,4-diamino-6-[2'-ethyl-4'-methylimidazolyl-(1')]-ethyl-s-triazine (trade name; 2E4MZ-A), 2,4-diamino-6-[2'-methylimidazolyl-(1')]-ethyl-s-triazine isocyanuric acid adduct (trade name; 2MA-OK), 2-phenyl-4,5-dihydroxymethylimidazole (trade name; 2PHZ-PW), and 2-phenyl-4-methyl-5-hydroxymethylimidazole (trade name; 2P4MZ-PW) (all of these compounds are manufactured by Shikoku Chemicals Corporation).

Among these curing accelerators, an imidazole-based curing accelerator is preferable because the activation energy can be easily adjusted to be 30 kJ/mol to 80 kJ/mol and the curing reaction at a kneading temperature can be suppressed, 2-phenyl-4,5-dihydroxymethylimidazole and 2,4-diamino-6-[2'-ethyl-4'-methylimidazolyl-(1')]-ethyl-s-triazine are more preferable, and 2-phenyl-4,5-dihydroxymethylimidazole is further preferable.

The content of the curing accelerator is preferably 0.2 part by weight or more, more preferably 0.5 part by weight or more, and further preferably 0.8 part by weight or more to 100 parts by weight as the total content of the epoxy resin and the phenol novolak-based curing agent. If the content is 0.2 part by weight or more, the activation energy can be easily adjusted to be 80 kJ/mol or less. The content of the curing accelerator is preferably 5 parts by weight or less and more preferably 2 parts by weight or less to 100 parts by weight as the total content of the epoxy resin and the phenol novolak-based curing agent. If the content is 5 parts by weight or less, the activation energy can be easily adjusted to be 30 kJ/mol or more.

The resin sheet 11 preferably contains a thermoplastic resin (elastomer).

Examples of the thermoplastic resin include natural rubber, butyl rubber, isoprene rubber, chloroprene rubber, an ethylene-vinylacetate copolymer, an ethylene-acrylic acid copolymer, an ethylene-acrylate copolymer, a polybutadiene resin, a polycarbonate resin, a thermoplastic polyimide resin, polyamide resins such as 6-nylon and 6,6-nylon, a phenoxy resin, an acrylic resin, saturated polyester resins such as PET and PBT, a polyamideimide resin, a fluoro resin, a styrene-isobutylene-styrene triblock copolymer, and a methylmethacrylate-butadiene-styrene copolymer (MBS resin). These thermoplastic resins may be used alone or in combination of two or more thereof.

The content of the thermoplastic resin in the resin sheet 11 is preferably 1% by weight or more. If the content is 1% by weight or more, softness and flexibility can be provided to the resin sheet 11. The content of the thermoplastic resin in the resin sheet 11 is preferably 30% by weight or less. If the content is 30% by weight or less, good adhering strength of the resin sheet 11 to a semiconductor chip can be obtained.

The resin sheet 11 preferably contains an inorganic filler. Incorporation of the inorganic filler increases the storage modulus E' and decreases the thermal expansion coefficient α.

Examples of the inorganic filler include quartz glass, talc, silica (fused silica, crystalline silica, etc.), alumina, aluminum nitride, silicon nitride, and boron nitride. Among these inorganic fillers, silica and alumina are preferable, and silica is more preferable because the thermal expansion coefficient can be reduced well. Silica is preferably fused silica and more preferably spherical fused silica because of its excellent fluidity.

The average particle size of the inorganic filler is preferably 0.5 μm or more, and more preferably 5 μm or more. If the average particle size is 0.5 μm or more, the flexibility and softness of the resin sheet 11 can be easily obtained. The average particle size of the inorganic filler is preferably 50 μm or less, and more preferably 30 μm or less. If the average particle size is 50 μm or less, a high filling rate of the inorganic filler can be easily obtained.

For example, the average particle size can be measured by using a laser diffraction-scattering type particle size distribution measuring apparatus on a sample that is arbitrarily extracted from a population.

The inorganic filler is preferably treated (pretreated) with a silane coupling agent. By this treatment, wettability of the inorganic filler to the resin can be improved, and dispersibility of the inorganic filler can be enhanced.

The silane coupling agent is a compound having a hydrolyzable group and an organic functional group in a molecule.

Examples of the hydrolyzable group include alkoxy groups having 1 to 6 carbon atoms such as a methoxy group and an ethoxy group, an acetoxy group, and a 2-methoxyethoxy group. Among these, a methoxy group is preferable because it is easy to remove a volatile component such as an alcohol generated by hydrolysis.

Examples of the organic functional group include a vinyl group, an epoxy group, a styryl group, a methacrylic group, an acrylic group, an amino group, a ureido group, a mercapto group, a sulfide group, an isocyanate group. Among these, an epoxy group is preferable because the epoxy group can easily react with an epoxy resin and a phenol novolak-based curing agent.

Examples of the silane coupling agent include vinyl group-containing silane coupling agents such as vinyltrimethoxysilane and vinyltriethoxysilane; epoxy group-containing silane coupling agents such as 2-(3,4-epoxycyclohexyl)ethyltrimethoxysilane and 3-glycidoxypropyl methyldimethoxysilane, 3-glycidoxypropyl trimethoxysilane, 3-glycidoxypropyl methyldiethoxysilane, and 3-glycidoxypropyl triethoxysilane; styryl group-containing silane coupling agents such as p-styryltrimethoxysilane; methacrylic group-containing silane coupling agents such as 3-methacryloxypropylmethyldimethoxysilane, 3-methacryloxypropyltrimethoxysilane, 3-methacryloxypropylmethyldiethoxysilane, and 3-methacryloxypropyltriethoxysilane; acrylic group-containing silane coupling agents such as 3-acryloxypropyltrimethoxysilane; amino group-containing silane coupling agents such as N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, and N-(vinylbenzyl)-2-aminoethyl-3-aminopropyltrimethoxysilane; ureido group-containing silane coupling agents such as 3-ureidopropyltriethoxysilane; mercapto group-containing silane coupling agents such as 3-mercaptopropylmethyldimethoxysilane and 3-mercaptopropyltrimethoxysilane; sulfide group-containing silane coupling agents such as bis(triethoxysilylpropyl)tetrasulfide; and isocyanate group-containing silane coupling agents such as 3-isocyanatepropyltriethoxysilane.

A method of treating the inorganic filler with the silane coupling agent is not especially limited, and examples thereof include a wet method of mixing the inorganic filler and the silane coupling agent in a solvent and a dry method of treating the inorganic filler with the silane coupling agent in a gas phase.

The amount of the silane coupling agent to be used for the treatment is not especially limited; however, 0.1 to 1 part by weight of the silane coupling agent is preferably used for the treatment to 100 parts by weight of the non-treated inorganic filler.

The content of the inorganic filler in the resin sheet 11 is preferably 20% by volume or more, more preferably 70% by volume or more, and further preferably 74% by volume or more. If the content is 20% by volume or more, the value of α×E' can be easily adjusted to be 10,000 Pa/K or more. On the other hand, the content of the inorganic filler is preferably 90% by volume or less, and more preferably 85% by volume or less. If the content is 90% by volume or less, good followability of the resin sheet to the unevenness can be obtained. In addition, the value of α×E' can be easily adjusted to be 300,000 Pa/K or less.

The content of the inorganic filler can be described by using "% by weight" as a unit. As a typical example, the content of silica is described by using "% by weight" as a unit.

The specific gravity of silica is normally 2.2 g/cm$^3$. Therefore, a preferred range of the content (% by weight) of silica is as follows.

The content of silica in the resin sheet 11 is preferably 81% by weight or more, and more preferably 84% by weight or more. The content of silica in the resin sheet 11 is preferably 94% by weight or less, and more preferably 91% by weight or less.

The specific gravity of alumina is normally 3.9 g/cm$^3$. Therefore, a preferred range of the content (% by weight) of alumina is as follows.

The content of alumina in the resin sheet 11 is preferably 88% by weight or more, and more preferably 90% by weight or more. The content of alumina in the resin sheet 11 is preferably 97% by weight or less, and more preferably 95% by weight or less.

Besides the components described above, the resin sheet 11 may contain, as needed, other compounding agents generally used in manufacture of a sealing resin, such as a flame retardant component, a pigment, and a silane coupling agent.

Examples of the flame retardant component include various types of metal hydroxides such as aluminum hydroxide, magnesium hydroxide, iron hydroxide, calcium hydroxide, tin hydroxide, and complex metal hydroxides; and a phosphazene compound. Among these flame retardant components, a phosphazene compound is preferable because of its excellent flame retardancy and strength after curing.

The pigment is not particularly limited, and an example thereof is carbon black.

A method for manufacturing the resin sheet 11 is not particularly limited; however, it is preferable to employ a method of performing plastic working on a kneaded product obtained by kneading components described above (for example, the epoxy resin, the phenol novolak-based curing agent, the inorganic filler, and the curing accelerator) to form a sheet. By this working, the resin sheet 11 can be highly filled with the inorganic filler, and the thermal expansion coefficient can be designed to be low.

Specifically, the epoxy resin, the phenol novolak-based curing agent, the inorganic filler, the curing accelerator, etc. are melted and kneaded using a known kneader such as a mixing roll, a pressurizing kneader, and an extruder to prepare a kneaded product, and the obtained kneaded product is subjected to plastic working to form a sheet. As kneading conditions, the upper limit of the temperature is preferably 140° C. or lower, and more preferably 130° C. or lower. The lower limit of the temperature is preferably higher than or equal to the softening point of components described above, and is 30° C. or higher, and preferably 50° C. or higher, for example. The kneading time is preferably 1 minute to 30 minutes. The kneading is preferably performed under a reduced pressure condition (under a reduced pressure atmosphere), and the pressure under the reduced pressure condition is $1 \times 10^{-4}$ kg/cm$^2$ 0.1 kg/cm$^2$, for example.

It is preferred to apply the plastic working to the kneaded product after the melt kneading in the state that the kneaded product keeps a high temperature without being cooled. The method for the plastic working is not particularly limited, and examples thereof include flat plate pressing, T-die extrusion, screw die extrusion, rolling, roll kneading, inflation extrusion, co-extrusion, and calendering methods. The plastic working temperature is preferably not lower than the respective softening points of the above-mentioned individual components, and is, for example, from 40 to 150° C., preferably from 50 to 140° C., more preferably from 70 to 120° C., considering the thermosetting property and the moldability of the epoxy resin.

The thickness of the resin sheet 11 is not particularly limited; however, the thickness is preferably 100 µm or more, and more preferably 150 µm or more. The thickness of the resin sheet 11 is preferably 2,000 µm or less, and more preferably 1,000 µm or less. If the thickness if within the above-described range, the semiconductor chip can be sealed well.

FIG. 1 shows a case in which the resin sheet 11 is composed of a single layer; however, the resin sheet 11 is not limited to be composed of a single layer and may have a multilayer structure.

The resin sheet 11 is used to seal a semiconductor chip.
[Method for Manufacturing Semiconductor Package]
For example, a semiconductor package can be obtained by performing the following steps.
(Preparation Step)

Figure 2:
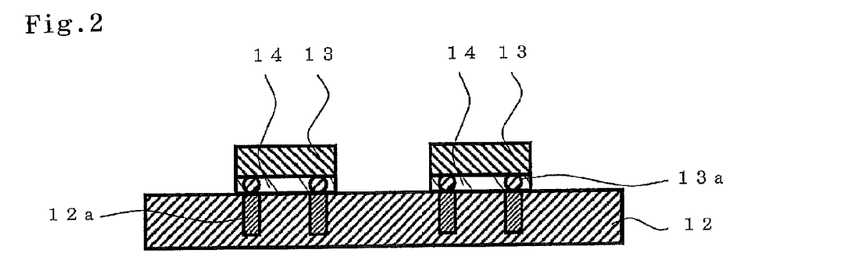
FIG. 2 is a schematic cross-sectional view of a semiconductor wafer on which semiconductor chips are flip-chip mounted.

In the preparation step, a semiconductor wafer 12 is prepared, on which a plurality of semiconductor chips 13 are to be flip-chip mounted (see FIG. 2). Bumps 13a are normally formed on a circuit formation surface (active surface) of the semiconductor chip 13. In addition, electrodes 12a are normally formed on the circuit formation surface (active surface) of the semiconductor wafer 12. The semiconductor chip 13 and the semiconductor wafer 12 are normally electrically connected with each other. FIG. 2 shows an example in which the semiconductor chip 13 and the semiconductor wafer 12 are electrically connected through the bumps 13a and the electrodes 12a. A known apparatus such as a flip-chip bonder and a die bonder can be used to mount the semiconductor chip 13 on the semiconductor wafer 12. The space between the semiconductor chip 13 and the semiconductor wafer 12 can be filled with an underfill material 14 as necessary.

(Sealing Step)

Figure 3:
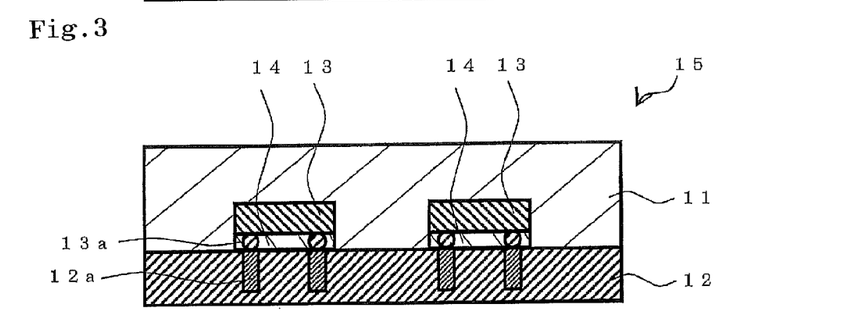
FIG. 3 is a drawing schematically showing a state where semiconductor chips are sealed with the resin sheet of Embodiment 1.

In the sealing step, the semiconductor chips 13 are sealed with the resin sheet 11 (see FIG. 3). Accordingly, a sealed body 15 (semiconductor package 15) is obtained having the resin sheet 11 and the semiconductor chips 13 embedded in the resin sheet 11. An example of a method for sealing the semiconductor chips 13 with the resin sheet 11 is a method of laminating the resin sheet 11 on the semiconductor chips 13 flip-chip bonded to the semiconductor wafer 12, and heat-pressing the laminate including the semiconductor wafer 12, the semiconductor chips 13 flip-chip bonded to the semiconductor wafer 12 and the resin sheet 11 arranged on the semiconductor chips 13 in a parallel plate manner to embed the semiconductor chips 13 in the resin sheet 11.

For example, the heat-pressing conditions when the semiconductor chips 13 are embedded in the resin sheet 11 are as follows: a temperature of 40° C. to 100° C., preferably 50° C. to 90° C.; a pressure of 0.1 MPa to 10 MPa, preferably 0.5 MPa to 8 MPa; and a time of 0.3 minute to 10 minutes, preferably 0.5 minute to 5 minutes. The pressing is preferably performed under a reduced pressure condition (for example, 0.1 kPa to 5 kPa) in consideration of improving the tackiness and the followability of the resin sheet 11 to the semiconductor chips 13 and the semiconductor wafer 12.
(Thermal Curing Step)

The resin sheet 11 of the sealed body 15 is thermally cured.

Because the resin sheet 11 satisfies the formula (1), the thermal curing can be performed at a relatively low temperature. The conditions of the thermal curing treatment are not particularly limited, and examples thereof are as follows.

The heating temperature as a condition of the thermal curing treatment is preferably 100° C. or higher, and more preferably 120° C. or higher. On the other hand, the upper limit of the heating temperature is preferably 200° C. or lower, and more preferably 180° C. or lower. If the heating temperature is within the above-described range, the amount of warpage of the sealed body 15 can be made small and the generation of voids can be suppressed.

The heating time is preferably 10 minutes or more, and more preferably 30 minutes or more. On the other hand, the upper limit of the heating time is preferably 300 minutes or less, and more preferably 180 minutes or less. The resin sheet 11 may be pressurized as necessary. The pressure is preferably 0.1 MPa or more, and more preferably 0.5 MPa or more. On the other hand, the upper limit of the pressure is preferably 10 MPa or less, and more preferably 5 MPa or less.
(Grinding Step)

Figure 4:
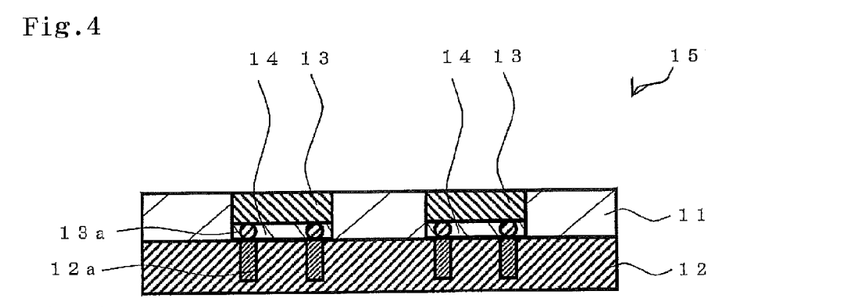
FIG. 4 is a drawing schematically showing a state after a portion of the resin sheet of a semiconductor package is ground.

The resin sheet 11 of the sealed body 15 is ground as necessary (see FIG. 4). An example of the grinding method is a grinding method using a grinding stone rotating at a high speed.
(Rewiring Layer Formation Step)

Figure 5:
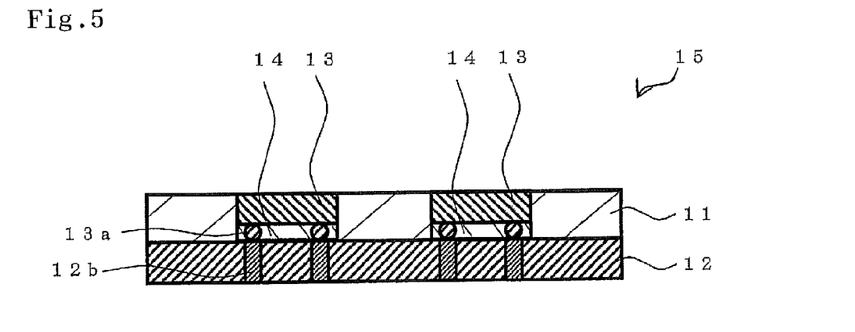
FIG. 5 is a drawing schematically showing a state after a portion of a semiconductor wafer of the semiconductor package is ground.
Figure 6:
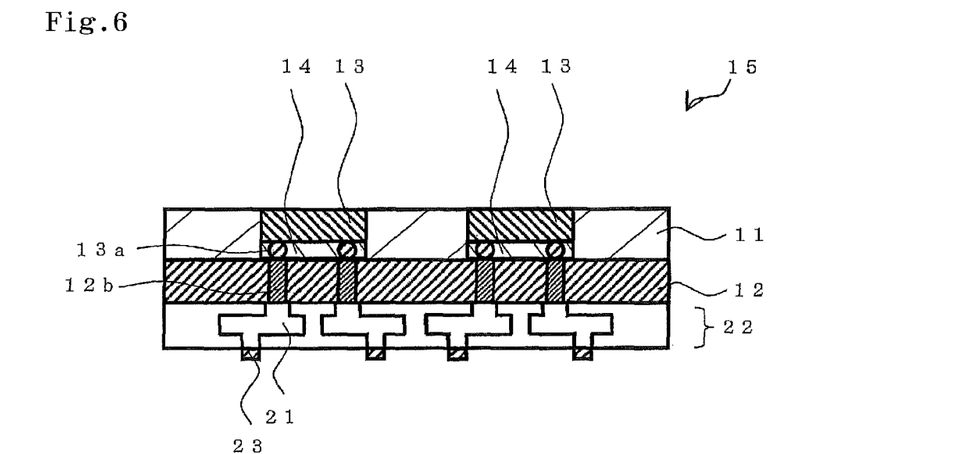
FIG. 6 is a drawing schematically showing a state after a rewiring layer and bumps are formed in the semiconductor package.

The semiconductor wafer 12 of the sealed body 15 is ground as necessary. Vias 12b can be formed by grinding (see FIG. 5). An example of the grinding method is a grinding method using a grinding stone rotating at a high speed. Next, a rewiring layer 22 having wires 21 is formed on the sealed body 15 as necessary (see FIG. 6). Then, bumps 23 are formed on the wires 21 as necessary. FIG. 6 shows an example in which the via 12b and the wire 21 are connected with each other.
(Dicing Step)

Figure 7:
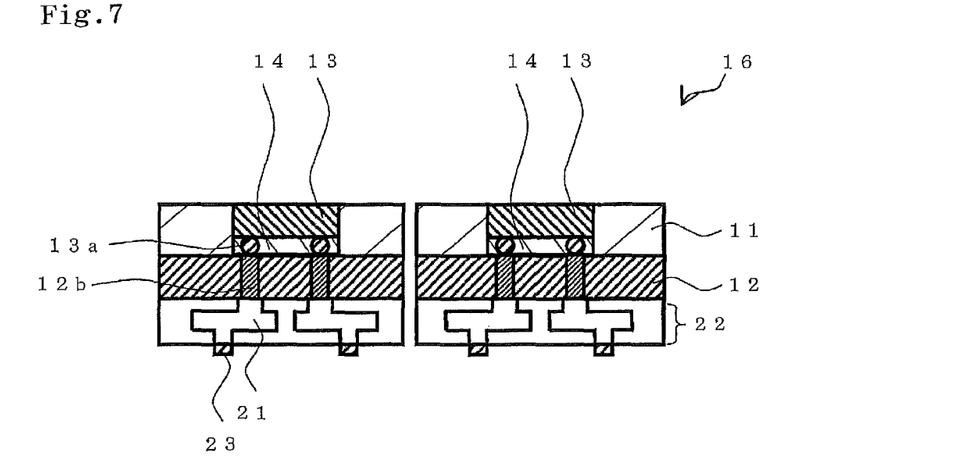
FIG. 7 is a drawing schematically showing a state after the semiconductor package is diced.

The sealed body 15 is diced as necessary (see FIG. 7). Accordingly, a chip-shaped semiconductor package 16 can be obtained.

(Substrate Mounting Step)

The sealed body 15 or the semiconductor package 16 is mounted on a substrate as necessary.

(Laser Marking Step)

Laser marking can be performed on the sealed body 15 or the semiconductor package 16 at any timing. For example, the laser marking may be performed on the sealed body 15 before thermal curing, the laser marking may be performed on the sealed body 15 after thermal curing, or the laser marking may be performed on the semiconductor package 16.

[Method for Manufacturing Semiconductor Package]

For example, the following steps can be performed to obtain a semiconductor package. The following steps are suitable for manufacturing a fan-out type wafer level package (WLP).

(Temporary Fixing Step)

Figure 8:
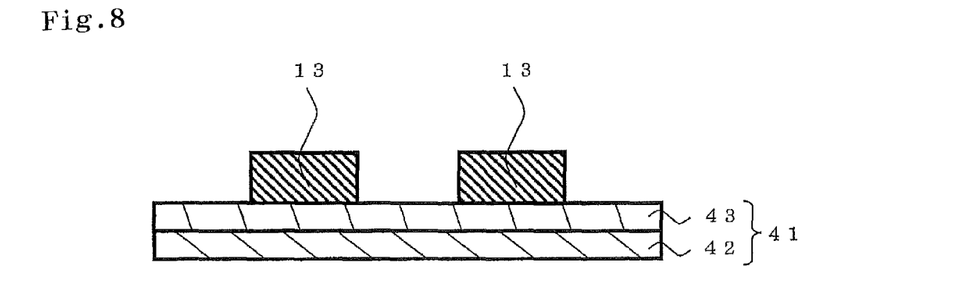
FIG. 8 is a drawing schematically showing a state where the semiconductor chips are fixed to a temporary fixing material.

First, a plurality of the semiconductor chips 13 are fixed on a temporary fixing material 41 (see FIG. 8). The circuit formation surface of the semiconductor chips 13 is arranged and fixed to face the temporary fixing material 41 as necessary. A known apparatus such as a flip-chip bonder and a die bonder can be used to fix the semiconductor chips 13.

The temporary fixing material 41 normally has a support 42 and a pressure-sensitive adhesive layer 43 laminated on the support 42.

The pressure-sensitive adhesive layer 43 is not particularly limited; however, a heat-releasable pressure-sensitive adhesive layer, a radiation curing type pressure-sensitive adhesive layer, etc. are normally used because the pressure-sensitive adhesive layer 43 can be easily peeled off. The material of the support 42 is not particularly limited, and examples thereof include metal materials such as SUS and plastic materials such as polyimide, polyamideimide, polyetheretherketone, and polyethersulfone.

(Sealing Step)

Figure 9:
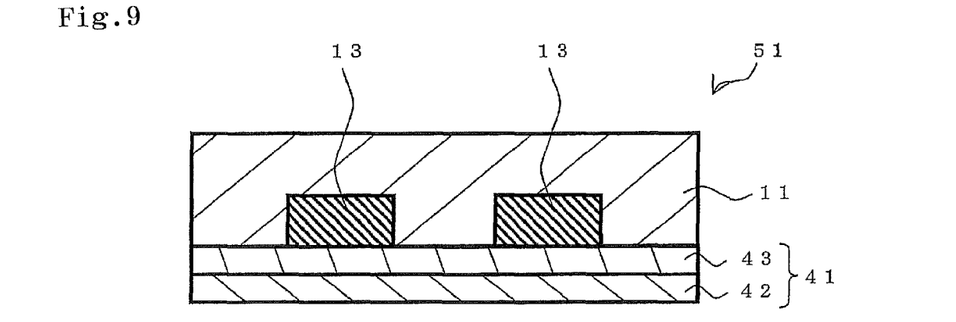
FIG. 9 is a drawing schematically showing a state where the semiconductor chips are sealed with the resin sheet.

In the sealing step, the semiconductor chips 13 are sealed with the resin sheet 11 (see FIG. 9). Accordingly, a sealed body 51 is obtained having the resin sheet 11 and the semiconductor chips 13 embedded in the resin sheet 11. An example of a method for sealing the semiconductor chips 13 with the resin sheet 11 is a method of laminating the resin sheet 11 on the semiconductor chips 13 arranged on the temporary fixing material 41, and heat-pressing the laminate including the temporary fixing material 41, the semiconductor chips 13 arranged on the temporary fixing material 41 and the resin sheet 11 arranged on the semiconductor chips 13 in a parallel plate manner to embed the semiconductor chips 13 in the resin sheet 11.

The heat-pressing conditions when the semiconductor chips 13 are embedded in the resin sheet 11 described in the method described above can be adopted.

(Thermal Curing Step)

The sealed body 51 is thermally cured (The resin sheet 11 of the sealed body 51 is thermally cured).

The conditions of the thermal curing treatment described in the method described above can be adopted.

(Peeling Step)

Figure 10:
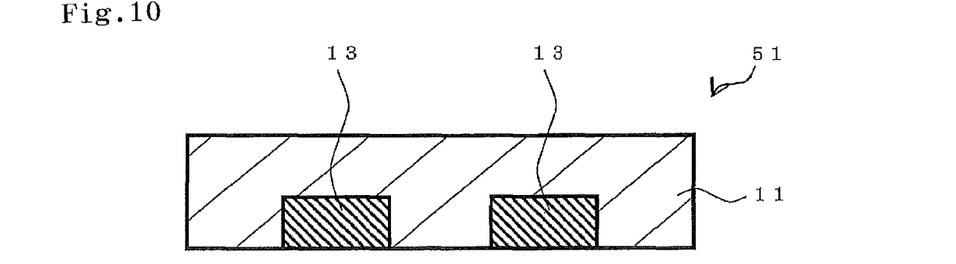
FIG. 10 is a drawing schematically showing a state after the temporary fixing material is peeled from a sealed body.

The temporary fixing material 41 is peeled from the sealed body 51 (see FIG. 10). The peeling method is not particularly limited; however, the adhesive strength of the pressure-sensitive adhesive layer 43 is preferably decreased before peeling the temporary fixing material 41. For example, when the pressure-sensitive adhesive layer 43 is a heat-releasable pressure-sensitive adhesive layer, the pressure-sensitive adhesive layer 43 is heated and the temporary fixing material 41 is peeled after the adhesive strength of the pressure-sensitive adhesive layer 43 is decreased.

(Grinding Step)

Figure 11:
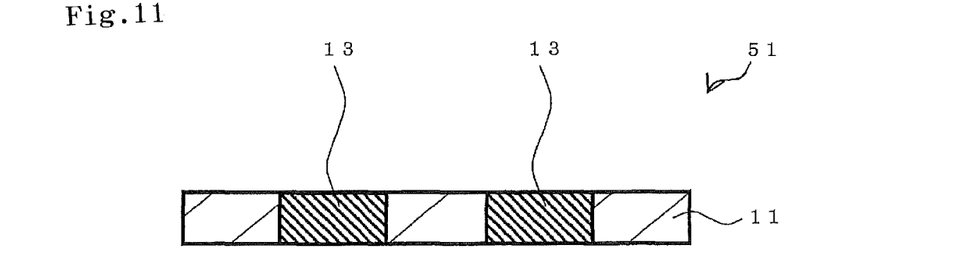
FIG. 11 is a drawing schematically showing a state after a portion of the resin sheet of the semiconductor package is ground.

Then, the resin sheet 11 of the sealed body 15 is ground as necessary (see FIG. 11). An example of the grinding method is a grinding method using a grinding stone rotating at a high speed.

(Wiring Layer Formation Step)

Figure 12:
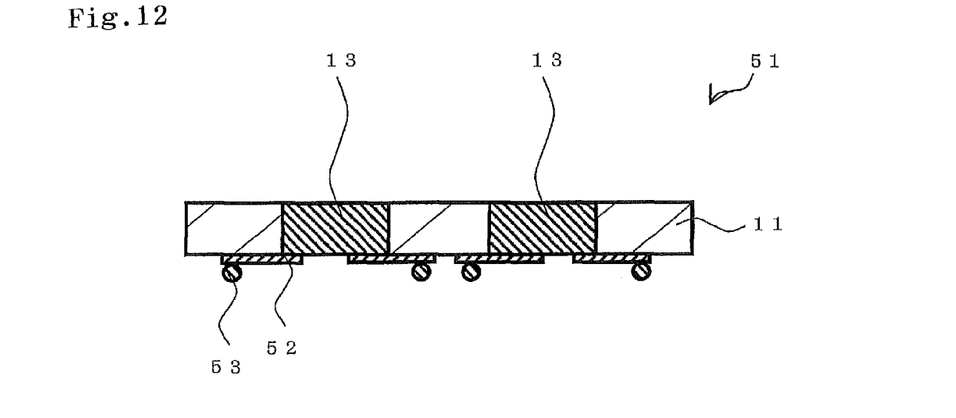
FIG. 12 is a drawing schematically showing a state after a rewiring layer and bumps are formed in the sealed body.

Rewires 52 are formed on the sealed body 51 using a semi additive method, etc. (see FIG. 12). FIG. 12 shows an example in which the rewire 52 and the semiconductor chip 13 are connected with each other.

Then, an insulating layer of polyimide or polybenzoxazole (PBO) is formed on the surface of the sealed body 51 on which the rewires 52 are formed. For example, a film such as a dry film resist is laminated on the surface to form the insulating layer.

Next, a bumping process is performed in which bumps 53 are formed on the rewires 52. The bumping process can be performed by a known method such as solder ball and solder plating.

(Dicing Step)

Figure 13:
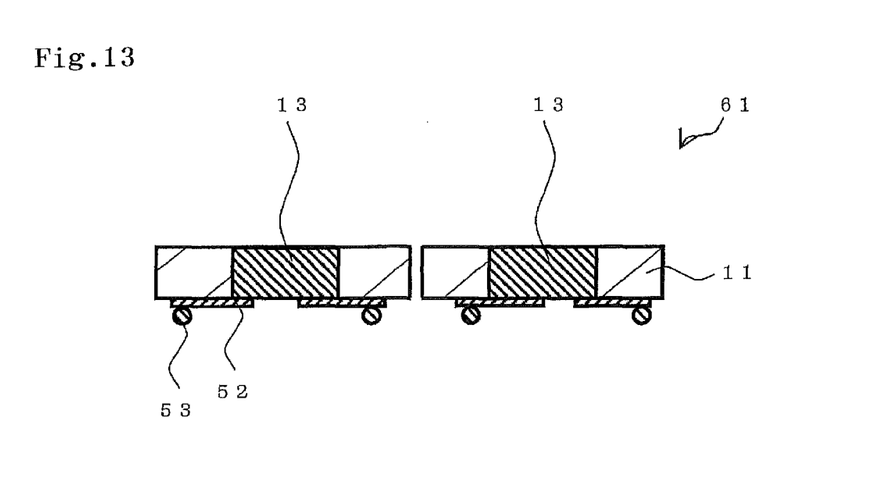
FIG. 13 is a drawing schematically showing a state after the sealed body is diced.

The sealed body 51 having the semiconductor chips 13, the resin sheet 11, the rewires 52, etc. may be diced (see FIG. 13). Accordingly, a semiconductor package 61 can be obtained in which the wires are drawn out to the outside of the chip region. The sealed body 51 may be used as a semiconductor package as it is without being diced.

(Substrate Mounting Step)

The semiconductor package 61 is mounted on a substrate as necessary.

(Laser Marking Step)

Laser marking can be performed on the sealed body 51 or the semiconductor package 61 at any timing. For example, the laser marking may be performed on the sealed body 51 before thermal curing, the laser marking may be performed on the sealed body 51 after thermal curing, or the laser marking may be performed on the semiconductor package 61.

Accordingly, the semiconductor package 16 or 61 can be manufactured by a method including a Step (A) of forming the sealed body 15 or 51 having the resin sheet 11 and one or a plurality of the semiconductor chips 13 embedded in the resin sheet 11 and a Step (B) of thermally curing the resin sheet 11 of the sealed body 15 or 51.

In the Step (A), the semiconductor chip 13 flip-chip bonded to the semiconductor wafer 12 may be embedded in the resin sheet 11 to form the sealed body 15. In the Step (A), a plurality of the semiconductor chips 13 flip-chip bonded to the semiconductor wafer 12 can be embedded in the resin sheet 11 to form the sealed body 15. The above-described method may further include a Step (C) of dicing the sealed body 15 into intended semiconductor chips after the Step (B).

In the Step (A), the semiconductor chip 13 fixed to the temporary fixing material 41 may be embedded in the resin sheet 11 to form the sealed body 51.

EXAMPLES

The preferred working examples of the present invention will be described in detail below. However, the materials, the compounding amounts, etc. described in the working examples are not intended to limit the scope of the present invention thereto unless otherwise specified in a limitative manner.

The components used in the working examples will be described.

Epoxy resin A: "YSLV-80XY" manufactured by Nippon Steel Chemical Co., Ltd. (bisphenol F epoxy resin, epoxy equivalent 200 g/eq, softening point 80° C.)

Epoxy resin B: "EPPN501-HY" manufactured by Nippon Kayaku Co., Ltd. (epoxy equivalent 169 g/eq, softening point 60° C.)

Phenol resin A: "MEH-7851-SS" manufactured by Meiwa Plastic Industries, Ltd. (phenol novolak resin having a biphenylaralkyl skeleton, hydroxyl equivalent 203 g/eq, softening point 67° C.)

Phenol resin B: "MEH-7500-3S" manufactured by Meiwa Plastic Industries, Ltd. (phenol novolak resin, hydroxyl equivalent 103 g/eq, softening point 83° C.)

Curing accelerator A: "2PHZ-PW" manufactured by Shikoku Chemicals Corporation 2-phenyl-4,5-dihydroxymethylimidazole Curing accelerator B: "TPP-K" manufactured by Hokko Chemical Industry Co., Ltd. (tetraphenylphosphonium tetraphenylborate)

Curing accelerator C: "2E4MZ-A" manufactured by Shikoku Chemicals Corporation 2,4-diamino-6-[2'-ethyl-4'-methylimidazolyl-(1')]-ethyl-s-triazine Elastomer A: "SIBSTAR 072T" manufactured by Kaneka Corporation (styrene-isobutylene-styrene triblock copolymer)

Elastomer B: an acrylic copolymer obtained from Synthesis Example 1 (a copolymer in which "butyl acrylate:acrylonitrile:glycidyl methacrylate=85:8:7 (% by weight), weight average molecular weight 800,000)

Inorganic filler A: "FB-9454" manufactured by Denka Co., Ltd. (spherical fused silica powder, average particle size 20 μm)

Inorganic filler B: "SO-25R" manufactured by Admatechs (spherical fused silica powder, average particle size 0.5 μm)

Silane coupling agent: "KBM-403" manufactured by Shin-Etsu Chemical Co., Ltd.

3-Glycidoxypropyltrimethoxysilane

Carbon black: "#20" manufactured by Mitsubishi Chemical Corporation

Synthesis Example 1

Radical polymerization was performed using butyl acrylate, acrylonitrile, and glycidyl methacrylate at a feed weight ratio of 85:8:7 and using 2,2'-azobisisobutylonitrile as a polymerization initiator under a nitrogen gas stream in methyl ethyl ketone at 70° C. for 5 hours and 80° C. for 1 hour to obtain the acrylic copolymer.

Examples and Comparative Examples

According to the compounding ratio described in Table 1, components were blended with a mixer. The resulting mixture was melted and kneaded at 120° C. for 2 minutes using a biaxial kneader, and the kneaded product was extruded from a T die to produce a resin sheet having a thickness of 500 μm.

[Evaluations]

The following evaluations were performed using each of the obtained resin sheets. The results are shown in Table 1.

(Activation Energy)

The activation energy was calculated according to the following procedure using a Friedman method.

First, 10 mg of the resin sheet was weighed. DSC measurements were performed on 10 mg of the resin sheet using an apparatus "Q2000" (manufactured by TA Instruments) at heating rates of 1° C./min, 2° C./min, 5° C./min, and 10° C./min to obtain DSC curves.

For each of the obtained DSC curves, a temperature at which the integrated value at the exothermic peak reaches 20% of the whole peak was represented as "T1", a temperature at which the integrated value reaches 60% thereof was represented as "T2", and a time that was taken for the temperature to increase from T1 to T2 was represented as "dt", and "ln (dα/dt)" was calculated (dα=0.6−0.2=0.4).

The obtained "ln (dα/dt)" for each measurement condition was plotted in the "1/T2" axis, and a gradient of the graph (linear) was calculated from each plot using least-squares approximation. The gradient of the graph "Ea/R" was used to calculate "Ea" (see the following formula).

$$\ln \frac{d\alpha}{dt} = \ln[Af(\alpha)] - \frac{Ea}{R}\frac{1}{T}$$ [Formula 1]

α: Reaction rate
t: Time
A: Arrhenius's pre-exponential factor
Ea: Activation energy
R: Gas Constant
T: Temperature at "α"

(Measurement of Storage Modulus E')

The resin sheet was thermally cured at 150° C. for 1 hour, and the storage modulus was measured using a solid viscoelasticity measurement apparatus (model: RSA-III manufactured by Rheometric Scientific, Inc.). That is, the resin sheet was cut into a sample of 40 mm long×10 mm wide×200 μm thick, and the sample was set to a tool for film tensile measurement. A tensile storage modulus and a loss modulus in the temperature range of −50° C. to 300° C. were measured under conditions of a frequency of 1 Hz and a heating rate of 10° C./min to obtain the storage modulus (E') at 25° C. by reading the measurement data.

(Measurement of Thermal Expansion Coefficient α)

The resin sheet was thermally cured at 150° C. for 1 hour, and the thermally cured product was cut into a sample of 15 mm long×5 mm wide×200 μm thick. The sample was set to a tool for film tensile measurement of a thermomechanical measurement apparatus (model Q-400EM manufactured by TA Instruments), and the sample was placed under conditions of a tensile load of 2 g and a heating rate of 10° C./min in the temperature range of −50° C. to 300° C. The thermal expansion coefficient α was calculated from the expansion rate at 50° C. to 70° C.

(Measurement of Glass Transition Temperature)

The resin sheet was thermally cured by a heating treatment at 150° C. for 1 hour. Then, the resin sheet was cut into a rectangular shape of a thickness of 200 μm, a length of 40 mm (measured length), and a width of 10 mm using a razor blade, and the storage modulus and the loss modulus at −50° C. to 300° C. were measured by using a solid viscoelasticity measurement apparatus (RSA-III manufactured by Rheometric Scientific, Inc.). The measurement conditions were a frequency of 1 Hz and a heating rate of 10° C./min. Further, the value of tan δ (G" (loss modulus)/G' (storage modulus)) was calculated to obtain the glass transition temperature.

(Evaluation of Curing)

DSC Measurements were performed on a resin sheet heated at 110° C. for 5 hours and a resin sheet before the heating treatment using an apparatus "Q-2000" (manufactured by TA Instruments) to obtain a heating value (heating rate: 10° C./min). The case in which the exothermic peak was not observed in the resin sheet after the heating treatment or the case in which the heating value of the resin sheet after the heating treatment was 10% or less of the heating value of the resin sheet before the heating treatment was evaluated as ○. The case in which the heating value of the resin sheet after the heating treatment was larger than 10% of the heating value of the resin sheet before the heating treatment was evaluated as x.

(Evaluation of Warpage)

A temporary fixing pressure-sensitive adhesive sheet ("No. 3195V" manufactured by Nitto Denko Corporation) was laminated on a carrier (a glass plate having a size of 300 mm×400 mm×thickness 1.4 mm (TEMPAX glass)), a resin sheet was further laminated on the temporary fixing pressure-sensitive adhesive sheet in which semiconductor elements each having a size of 6 mm×6 mm×thickness 200 μm were arranged at an interval of 9 mm, and the laminate was heated at 150° C. for 1 hour. The resin sheet was peeled from the carrier, and the amount of warpage of the resin sheet was measured. The case in which the amount of warpage was 1 mm or less was evaluated as ○, and the case in which the amount of warpage was larger than 1 mm was evaluated as x.

(Filling Property)

A temporary fixing pressure-sensitive adhesive sheet ("No. 3195V" manufactured by Nitto Denko Corporation) was laminated on a carrier (a glass plate having a size of 300 mm×400 mm×thickness 1.4 mm (TEMPAX glass)), a resin sheet is further laminated on the temporary fixing pressure-sensitive adhesive sheet in which semiconductor elements each having a size of 6 mm×6 mm×thickness 200 μm were arranged at an interval of 9 mm, and the laminate was heated at 150° C. for 1 hour. The resin sheet was peeled from the carrier, and the peripheral part of the chip (the peripheral part of the semiconductor element) of the resin sheet was observed. The case in which no void was observed in the peripheral part of the chip was evaluated as ○, and the case in which one or more voids were observed in the peripheral part of the chip was evaluated as x.

(Thermal Cycle Test)

A temporary fixing pressure-sensitive adhesive sheet ("No. 3195V" manufactured by Nitto Denko Corporation) was laminated on a carrier (a glass plate having a size of 300 mm×400 mm×thickness 1.4 mm (TEMPAX glass)), a resin sheet was further laminated on the temporary fixing pressure-sensitive adhesive sheet in which semiconductor elements each having a size of 6 mm×6 mm×thickness 200 μm were arranged at an interval of 9 mm, and the laminate was heated at 150° C. for 1 hour. The laminate (molded product) was made into individual pieces to obtain a semiconductor package. A thermal cycle test (a temperature of −50° C. to 120° C., 1 hour per cycle) was performed on the obtained semiconductor package. The semiconductor package was observed after the thermal cycle test. The semiconductor package in which no cracking or peeling of resin was generated until 2,000 cycles or more was evaluated as ⊙, the semiconductor package in which no cracking or peeling was generated until 1,000 cycles or more was evaluated as ○, and the semiconductor package in which cracking or peeling was generated was evaluated as x.

TABLE 1

| | | Example 1 | Example 2 | Example 3 | Example 4 | Example 5 | Comparative Example 1 | Comparative Example 2 |
|---|---|---|---|---|---|---|---|---|
| Compounding (part by weight) | Epoxy Resin A | 286 | 169 | 100 | — | — | 286 | 169 |
| | Epoxy Resin B | — | — | — | 100 | 160 | — | — |
| | Phenol Resin A | 303 | 179 | 60 | 120 | — | 303 | 179 |
| | Phenol Resin B | — | — | — | — | 100 | — | — |
| | Curing Accelerator A | 6 | 6 | 3 | 2 | — | — | 6 |
| | Curing Accelerator B | — | — | — | — | — | 2 | — |
| | Curing Accelerator C | — | — | — | — | 10 | — | — |
| | Elastomer A | — | 152 | — | — | — | — | 348 |
| | Elastomer B | — | — | 160 | 150 | 180 | — | — |
| | Inorganic Filler | 3805 | 4400 | 240 | 300 | 320 | 3805 | 800 |
| | Silane Coupling Agent | 5 | 5 | 2 | 2 | 2 | 5 | 2 |
| | Carbon Black | 5 | 5 | 2 | 2 | 2 | 5 | 2 |
| Content (% by volume) of Inorganic Filler in Resin Sheet | | 80 | 81 | 30 | 31 | 33 | 80 | 45 |
| Evaluations | Ea [kJ/mol] | 73 | 84 | 90 | 105 | 39 | 123 | 85 |
| | α [ppm/K] | 5.5 | 9.5 | 60 | 98 | 88 | 5.1 | 45 |
| | E' [GPa] | 20.2 | 16.8 | 0.8 | 2.5 | 3.1 | 19.7 | 8.9 |
| | α × E' [Pa/K] | 111100 | 159600 | 48000 | 245000 | 272800 | 100470 | 400500 |
| | Tg [° C.] | 151 | 149 | 129 | 132 | 137 | 150 | 155 |
| | Evaluation of Curing | ○ | ○ | ○ | ○ | ○ | X | ○ |
| | Evaluation of Warpage | ○ | ○ | ○ | ○ | ○ | ○ | X |
| | Evaluation of Filling Property | ○ | ○ | ○ | ○ | ○ | ○ | ○ |
| | Thermal Cycle Test | ⊙ | ⊙ | ○ | ○ | ○ | ○ | X |

TABLE 1-continued

|  |  | Comparative Example 3 | Comparative Example 4 | Comparative Example 5 | Comparative Example 6 | Comparative Example 7 |
|---|---|---|---|---|---|---|
| Compounding (part by weight) | Epoxy Resin A | 286 | 169 | — | — | — |
|  | Epoxy Resin B | — | — | 100 | 100 | 80 |
|  | Phenol Resin A | 303 | 179 | 120 | 120 | — |
|  | Phenol Resin B | — | — | — | — | 50 |
|  | Curing Accelerator A | 40 | — | 3 | — | 6 |
|  | Curing Accelerator B | — | 1 | — | — | — |
|  | Curing Accelerator C | — | — | — | 10 | — |
|  | Elastomer A | — | 152 | — | — | — |
|  | Elastomer B | — | — | 330 | 330 | 1000 |
|  | Inorganic Filler | 3805 | 4400 | 550 | 550 | 600 |
|  | Silane Coupling Agent | 5 | 5 | 5 | 5 | 5 |
|  | Carbon Black | 5 | 5 | 5 | 5 | 5 |
| Content (% by volume) of Inorganic Filler in Resin Sheet |  | 79 | 74 | 36 | 36 | 30 |
| Evaluations | Ea [kJ/mol] | 28 | 130 | 89 | 58 | 75 |
|  | α [ppm/K] | 5.5 | 10 | 62 | 65 | 89 |
|  | E' [GPa] | 21.1 | 15.5 | 5.7 | 5.5 | 0.11 |
|  | α × E' [Pa/K] | 116050 | 155000 | 353400 | 357500 | 9790 |
|  | Tg [° C.] | 148 | 143 | 122 | 128 | 130 |
|  | Evaluation of Curing | ○ | X | ○ | ○ | ○ |
|  | Evaluation of Warpage | ○ | ○ | X | X | X |
|  | Evaluation of Filling Property | X | ○ | ○ | ○ | ○ |
|  | Thermal Cycle Test | ○ | ○ | X | X | X |

The warpage deformation of the resin sheet was reduced in examples in which the resin sheet that satisfied the formulae (1) and (2) was used. In examples, the thermal curing reaction progressed by the heating treatment at a relatively low temperature (heating treatment at 110° C. for 5 hours). In examples, the resin sheet followed the unevenness of the carrier because the resin sheet was heated at 150° C. for 1 hour, and no voids were observed in the peripheral part of the chip. In examples, cracking or peeling was not generated in the thermal cycle test.

On the other hand, some of the functions of the resin sheet was poor in comparative examples in which the resin sheet that did not satisfy either of the formulae (1) and (2) was used. For example, the progress of the thermal curing reaction was fast in Comparative Example 3, and the peripheral part of the chip was not filled with the resin sheet.

DESCRIPTION OF REFERENCE SIGNS

11 Resin sheet
12 Semiconductor wafer
12a Electrode
12b Via
13 Semiconductor chip
13a Bump
14 Underfill material
15 Sealed body
16 Semiconductor package
21 Wire
22 Rewiring layer
23 Bump
41 Temporary fixing material
42 Support
43 Pressure-sensitive adhesive layer
51 Sealed body
52 Rewire
53 Bump
61 Semiconductor package

The invention claimed is:

1. A thermally curable resin sheet for sealing a semiconductor chip, wherein
an activation energy (Ea) satisfies the following formula (1),
a glass transition temperature of a product thermally cured at 150° C. for 1 hour is 125° C. or higher, and
a thermal expansion coefficient α [ppm/K] of the thermally cured product at the glass transition temperature or lower and a storage modulus E' [GPa] at 25° C. of the thermally cured product satisfy the following formula (2):

$$30 \leq Ea \leq 120 [kJ/mol] \quad (1); \text{ and}$$

$$10{,}000 \leq \alpha \times E' \leq 300{,}000 [Pa/K] \quad (2).$$

2. The thermally curable resin sheet for sealing a semiconductor chip according to claim 1, comprising an epoxy resin, a phenol novolak-based curing agent, an inorganic filler, and a curing accelerator.

3. The thermally curable resin sheet for sealing a semiconductor chip according to claim 2, wherein the inorganic filler is silica having an average particle size of 0.5 μm to 50 μm.

4. The thermally curable resin sheet for sealing a semiconductor chip according to claim 2, wherein the curing accelerator is an imidazole-based curing accelerator.

5. The thermally curable resin sheet for sealing a semiconductor chip according to claim 2, wherein the content of the inorganic filler is 20% by volume to 90% by volume.

6. The thermally curable resin sheet for sealing a semiconductor chip according to claim 1, wherein the storage modulus E' at 25° C. of the thermally cured product is 3 GPa to 30 GPa.

7. The thermally curable resin sheet for sealing a semiconductor chip according claim 1, wherein the thermal expansion coefficient α is 3 ppm/K to 50 ppm/K.

8. A method for manufacturing a semiconductor package, comprising:
- a Step (A) of forming a sealed body having the thermally curable resin sheet for sealing a semiconductor chip according to claim 1 and one or more semiconductor chips embedded in the thermally curable resin sheet for sealing a semiconductor chip, and
- a Step (B) of thermally curing the resin sheet of the sealed body.

9. The method for manufacturing a semiconductor package according to claim 8, wherein the semiconductor chip(s) is/are flip chip(s) flip-chip bonded to a semiconductor wafer and is/are embedded in the thermally curable resin sheet for sealing a semiconductor chip to form the sealed body in the Step (A).

10. The method for manufacturing a semiconductor package according to claim 8, wherein the semiconductor chip(s) fixed to a temporary fixing material are embedded in the thermally curable resin sheet for sealing a semiconductor chip to form the sealed body in the Step (A).

11. The method for manufacturing a semiconductor package according to claim 8, wherein
- a plurality of the semiconductor chips are flip chips flip-chip bonded to a semiconductor wafer and are embedded in the thermally curable resin sheet for sealing a semiconductor chip to form the sealed body in the Step (A),
- and the method further comprises a Step (C) of dicing the sealed body into intended semiconductor chips after the Step (B).

* * * * *

UNITED STATES PATENT AND TRADEMARK OFFICE
CERTIFICATE OF CORRECTION

PATENT NO. : 9,659,883 B2
APPLICATION NO. : 15/023501
DATED : May 23, 2017
INVENTOR(S) : Kosuke Morita et al.

It is certified that error appears in the above-identified patent and that said Letters Patent is hereby corrected as shown below:

In the Claims

In Column 18 at Line 49 (approx.), at Claim 1, change "αXE'" to --α×E'--.

In Column 19 at Line 2, at Claim 7, change "according claim" to --according to claim--.

Signed and Sealed this
Twenty-eighth Day of August, 2018

Andrei Iancu
*Director of the United States Patent and Trademark Office*